United States Patent
Tokoro (10) Patent No.: US 8,120,387 B2
(45) Date of Patent: Feb. 21, 2012

(54) RECEIVING CIRCUIT, ELECTRONIC APPARATUS AND METHOD FOR CONTROLLING RECEIVING CIRCUIT

(75) Inventor: Tomokazu Tokoro, Tokyo (JP)

(73) Assignee: NEC Corporation, Tokyo (JP)

( * ) Notice: Subject to any disclaimer, the term of this patent is extended or adjusted under 35 U.S.C. 154(b) by 106 days.

(21) Appl. No.: 12/588,294

(22) Filed: Oct. 9, 2009

(65) Prior Publication Data
US 2010/0097103 A1 Apr. 22, 2010

(30) Foreign Application Priority Data
Oct. 22, 2008 (JP) ................................. 2008-271607

(51) Int. Cl.
*H03K 5/153* (2006.01)
(52) U.S. Cl. .......................................... 327/72; 375/287
(58) Field of Classification Search .................... None
See application file for complete search history.

(56) References Cited

U.S. PATENT DOCUMENTS

| | | | |
|---|---|---|---|
| 4,425,548 A * | 1/1984 | Kage | 327/166 |
| 4,580,278 A * | 4/1986 | Yamamoto | 375/354 |
| 6,664,908 B2 * | 12/2003 | Sundquist et al. | 341/143 |

FOREIGN PATENT DOCUMENTS

JP        6-244687        9/1994

* cited by examiner

*Primary Examiner* — Lincoln Donovan
*Assistant Examiner* — Sibin Chen
(74) *Attorney, Agent, or Firm* — McGinn IP Law Group, PLLC

(57) ABSTRACT

A receiving circuit includes a comparing circuit, a first storage circuit, a second storage circuit, and a voltage controlling circuit. The comparing circuit compares an input signal with a reference voltage and outputs a signal with either a first level when the input signal is larger than the reference voltage or a second level when the input signal is smaller than the reference voltage as a comparison result. The first storage circuit stores an output level of the comparing circuit for a next one cycle. The second storage circuit stores an output level of the first storage circuit for a next one cycle. The voltage controlling circuit controls a level of the reference voltage in each cycle on the basis of output levels of the first storage circuit and the second storage circuit.

4 Claims, 8 Drawing Sheets

WAVEFORM OF TRANSMISSION SIGNAL IN CASE OF SMALL ATTENUATION

FIG.4

WAVEFORM OF TRANSMISSION SIGNAL IN CASE OF LARGE ATTENUATION

FIG.5

IN CASE THAT VREF IS FIXED (DOTTED LINE INDICATES LEVEL OF VREF)

FIG.6

IN CASE OF DIFFERENTIAL TRANSMISSION
(BROKEN LINE INDICATES NEGATIVE SIGNAL)

RECEIVING CIRCUIT, ELECTRONIC APPARATUS AND METHOD FOR CONTROLLING RECEIVING CIRCUIT

This application is based upon and claims the benefit of priority from Japanese patent application No. 2008-271607, filed on Oct. 22, 2008, the disclosure of which is incorporated herein in its entirety by reference.

TECHNICAL FILED

The present invention relates to a receiving circuit, an electronic apparatus and a method for controlling the receiving circuit and particularly, relates to a receiving circuit, an electronic apparatus and a method for controlling the receiving circuit, which control a reference voltage used for receiving a high speed transmission signal.

BACKGROUND ART

Performance of an electronic apparatus (for example, computer) has been improved remarkably since a signal inside LSI (Large Scale Integration) and a signal between LSIs can transmit at a high speed. Meanwhile, attenuation of the signal through a transmission path inside the LSI becomes severely large, due to applying a fine rule to LSI. Moreover, since width of a printed wiring pattern of PWB (Printed Wiring Board) and a diameter of a signal wiring cable tend to become small to realize the high speed and high dense LSI, attenuation of the signal through the transmission paths of the PWB and the cable also becomes severely large. The increasing attenuation of the signal causes distortion of a signal waveform. Moreover, making transmission frequency high also causes the severe distortion of the signal waveform.

For this reason, it is very important to develop a technology to compensate for the distortion of the signal waveform. For example, a patent document 1 discloses a technology to receive an attenuated signal. The invention disclosed in the patent document 1 relates to a technology on a signal including a two-level signal and a repetitive signal (referred to as a CRI (clock run in) signal) which is allocated in front of the two-level signal and indicates phase and amplitude of the two-level signal. According to the invention of the patent document 1, after deciding whether the receiving CRI signal is a high-level signal or a low-level signal, a total of duration time of the high-level signal and a total of duration time of the low-level signal are measured respectively, and a reference voltage, which is used for deciding a level of the receiving two-level signal, is adjusted on the basis of a ratio of these duration times.

[Patent document 1] Japanese Patent Application Laid-Open No. 1994-244687

SUMMARY

An exemplary object of the invention is to provide a receiving circuit, an electronic apparatus and a method for controlling the receiving circuit.

In an exemplary embodiment, a receiving circuit includes a comparing circuit which compares an input signal with a reference voltage and outputs a signal with either a first level when the input signal is larger than the reference voltage or a second level when the input signal is smaller than the reference voltage as a comparison result, a first storage circuit which stores an output level of the comparing circuit for a next one cycle, a second storage circuit which stores an output level of the first storage circuit for a next one cycle, and a voltage controlling circuit which controls a level of the reference voltage in each cycle on the basis of output levels of the first storage circuit and the second storage circuit.

In an exemplary embodiment, an electronic apparatus includes a receiving circuit, including a comparing circuit which compares an input signal with a reference voltage and outputs a signal with either a first level when the input signal is larger than the reference voltage or a second level when the input signal is smaller than the reference voltage as a comparison result, a first storage circuit which stores an output level of the comparing circuit for a next one cycle, a second storage circuit which stores an output level of the first storage circuit for a next one cycle and a voltage controlling circuit which controls a level of the reference voltage in each cycle on the basis of output levels of the first storage circuit and the second storage circuit.

In an exemplary embodiment, a method for controlling a receiving circuit includes comparing an input signal with a reference voltage, storing an output level of a comparing circuit, which outputs a signal with either a first level when the input signal is larger than the reference voltage or a second level when the input signal is smaller than the reference voltage as a comparison result, in a first storage circuit, storing an output level of the first storage circuit in a second storage circuit, and controlling a level of the reference voltage in each cycle on the basis of output levels of the first storage circuit and the second storage circuit.

BRIEF DESCRIPTION OF THE DRAWINGS

Exemplary features and advantages of the present invention will become apparent from the following detailed description when taken with the accompanying drawings in which.

EXEMPLARY EMBODIMENT

Next, a first exemplary embodiment of the present invention will be described in detail with reference to a drawing.

Figure 1:
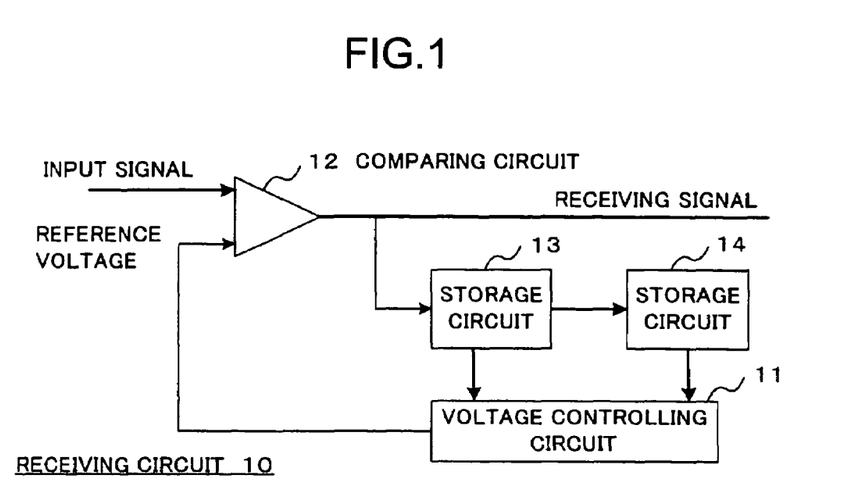
FIG. 1 shows a configuration of receiving circuit 10 according to a first exemplary embodiment of the present invention.

FIG. 1 shows a configuration of receiving circuit 10 according to the first exemplary embodiment of the present invention. With reference to FIG. 1, receiving circuit 10 includes comparing circuit 12 which outputs a signal with either a first level when a input signal is larger than the reference voltage or a second level when the input signal is smaller than the reference voltage, storage circuit 13 which stores an output signal of comparing circuit 12 for a next one cycle, storage circuit 14 which stores an output signal of storage circuit 13 for the next one cycle and voltage controlling circuit 11 which determines a level of the reference voltage on the basis of the output signals of storage circuit 13 and storage circuit 14. Further, a "level" means a value of voltage.

Receiving circuit 10 is usually mounted in LSI (Large Scale Integration) and LSI is mounted on PWB which is called a printed wiring board. Accordingly, receiving circuit 10 may receive a signal which is transmitted inside LSI and also may receive a signal which is transmitted from other LSI. Degree of distortion of a signal waveform depends on transmission distance (for example, transmission distance inside LSI and transmission distance between LSIs), transmission frequency or electrical characteristics of a transmission path.

Figure 2:
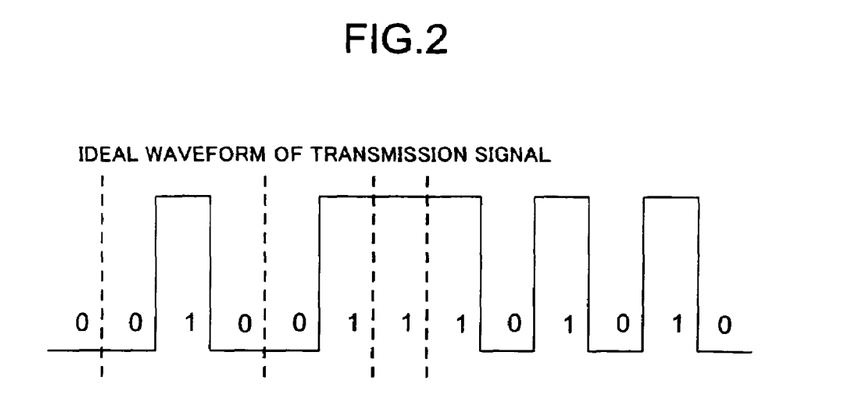
FIG. 2 shows an example of an ideal waveform of a transmission signal.
Figure 3:
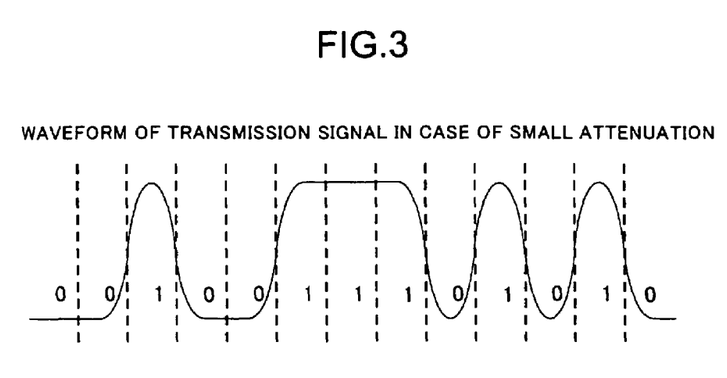
FIG. 3 shows an example of an actual waveform of the transmission signal.

An ideal waveform of the input signal is a rectangular waveform shown in FIG. 2. However, a signal waveform to be transmitted is changed actually to a signal waveform shown in FIG. 3. Further, the signal shown in FIG. 3 is a two-level signal and carries a logic signal out of a logic signal "0" and a logic signal "1" in one cycle. While the logic signal "0" and the logic signal "1" are mapped to a physically low-level signal and a physically high-level signal respectively in FIG. 3, it may be preferable that each logic signal is mapped reversely.

According to the signal waveform shown in FIG. 3, since voltage falls to the low level sufficiently in the cycle whose logic signal is "0", and voltage rises to the high level sufficiently in the cycle whose logic signal is "1", it is possible for comparing circuit 12 to decide the level of the input signal correctly through setting the level of the reference voltage to be intermediate between the low level and the high level. Further, one cycle means a period of time when one two-level signal, which is corresponding to one bit, is transmitted. That is, the signal carries one bit information which means to specify the logic signal "0" or the logic signal "1" in one cycle. Each cycle is denoted as T0, T1, T2 or the like in FIGS. 5, 6, 8 to 11 which will be described later.

Figure 4:
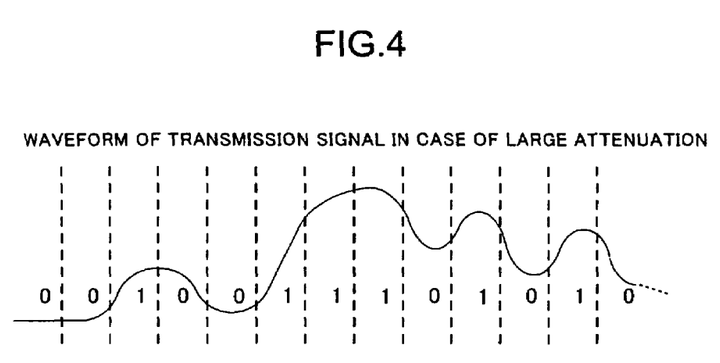
FIG. 4 shows an example of a severely distorted waveform of the transmission signal.
Figure 5:
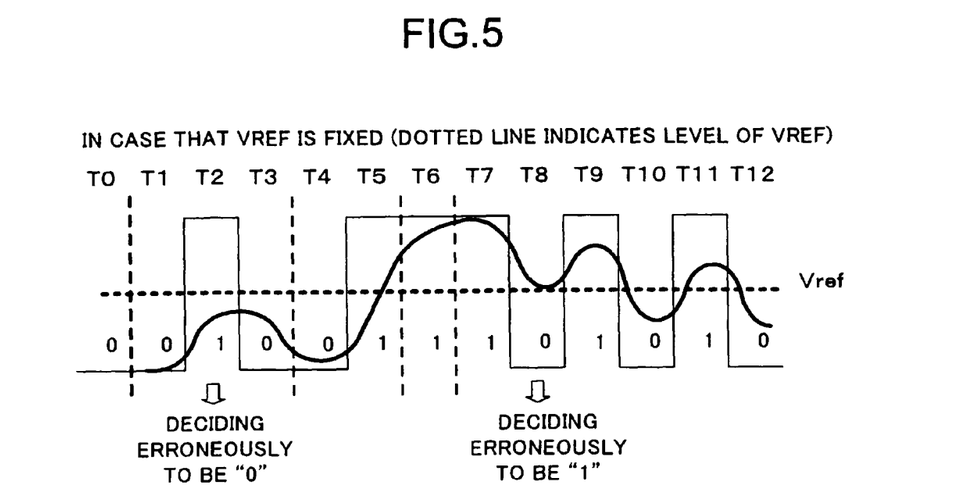
FIG. 5 shows an example of an erroneous decision in case of the severely distorted waveform of the transmission signal.

In case that the signal waveform is distorted as shown in FIG. 4, it is impossible for comparing circuit 12 to decide the level of the input signal correctly only by use of the fixed reference voltage even if the level of the reference voltage is fixed to an adequate level. FIG. 5 shows this situation. That is, FIG. 5 shows a case that the level of the reference voltage (referred to as Vref in FIG. 5) is set fixedly to a center of the low level and the high level. For example, in case of cycle T2, since the level of the input signal in the immediately preceding cycle is low, voltage does not rise to the level of the reference voltage in cycle T2. As a result, the input signal is decided erroneously to be the logic signal "0". Moreover, in case of cycle T8, since the immediately preceding level of the input signal is high, voltage does not fall to the level of the reference voltage in the cycle T8. As a result, the input signal is decided erroneously to be the logic signal "1". Later the immediately preceding level of the input signal means the level of the input signal in the immediately preceding cycle.

Figure 6:
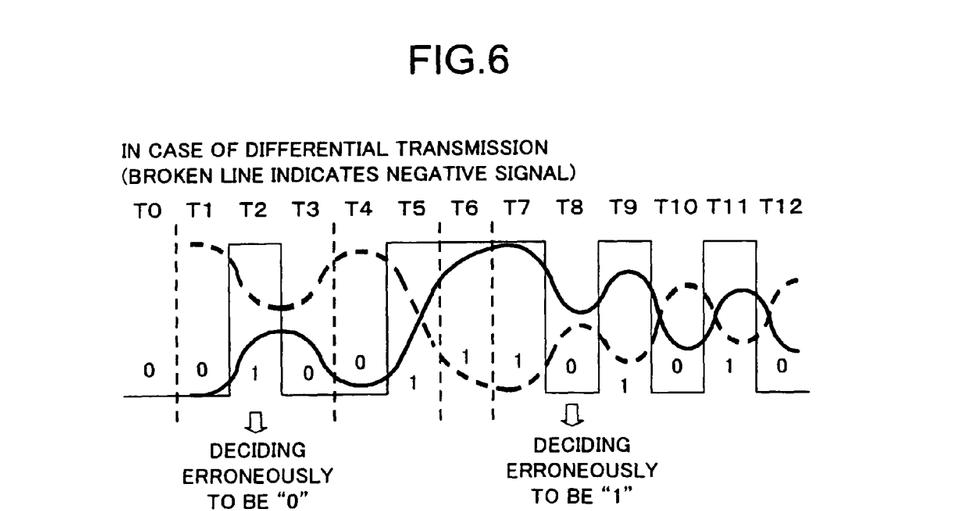
FIG. 6 shows an example of an erroneous decision in case of a severely distorted waveform of a differential transmission signal.

In case of a differential transmission, this problem is caused similarly and can not be solved. FIG. 6 shows this situation. According to the differential transmission method, a signal is transmitted as a combination of a positive signal (shown by a solid line in FIG. 6) and a negative signal (shown by a broken line in FIG. 6) and the signal is decided whether the transmitted signal is the logic signal "0" or the logic signal "1", based on a difference between the received positive signal and the received negative signal. Therefore, if the same noise is added commonly to two signals, the difference between two signals is not disturbed by the noise. For this reason, it may be possible to avoid the erroneous decision due to the noise, but the level of the input signal is decided erroneously in the cycles T2 and T8, due to the distortion of the signal waveform shown in FIG. 6, similarly to a case shown in FIG. 5.

Next, an operation of the first exemplary embodiment of the present invention will be described.

The present invention will be described when the first level is a high level, and the second level is a low level. The high level is a predetermined high voltage, and low level is a predetermined low voltage. It may be preferable to adopt a reverse mapping.

Comparing circuit 12 outputs the signal with either the high level or the low level through comparing the input signal with the reference voltage. Storage circuit 13 stores the output signal (receiving signal) of comparing circuit 12 for the next one cycle and storage circuit 14 stores the output signal of storage circuit 13 for the next one cycle.

With reference to both the output signal of storage circuit 13 which stores the value of the receiving signal in the cycle preceding to the present cycle by one cycle, and the output signal of storage circuit 14 which stores the value of the receiving signal in the cycle preceding to the present cycle by two cycles, voltage controlling circuit 11 selects a voltage value which is judged to be most suitable among a plurality of predetermined voltage values, and determines the most suitable voltage value to be the level of the reference voltage in the present cycle. Comparing circuit 12 decides the signal value of the input signal, based on the determined level of the reference voltage.

Thus, according to the first exemplary embodiment of the present invention, receiving circuit 10 can set the level of the reference voltage, which is used in the present cycle, to the suitable level on the basis of receiving signal values in the cycles preceding to the present cycle by one and two cycles. This level setting is repeated in every cycle. Since the level of the reference voltage can be selected by use of 2 bits information which the output signals of storage circuit 13 and storage circuit 14 carry, it is possible to select the level of the reference voltage among up to 4 levels of voltage. The level of the reference voltage is not specified in particular. It is possible to select the suitable level, based on the electrical characteristics of the transmission path, the characteristics of the device of which the sending circuit and the receiving circuit are made, the transmission frequency or the like.

In case that the transmission rate becomes high, there is a tendency that rise time or fall time of the input signal becomes long due to the distortion of the input signal, and that as a result, it becomes impossible for the level of the signal to reach the level of the reference voltage within one cycle, as shown in FIG. 5. That is, the level of the input signal tends to depend on the immediately preceding level of the input signal. It is comprehensible with reference to FIG. 5 that the immediately preceding level of the input signal can be estimated to some extent through obtaining the values of the receiving signals in two consecutive cycles immediately preceding to the present cycle. For example, in case of cycle T2, it is possible to estimate that the immediately preceding level of the input signal is low or almost low, since the values of the receiving signal in two consecutive cycles immediately preceding to cycle T2 are "0" and "0" respectively, and similarly, it is possible to estimate that the immediately preceding level of the input signal is high or almost high, since the values of the receiving signal in two consecutive cycles preceding to cycle T8 are "1" and "1" respectively.

While the level of the input signal must rise from the low level to the high level in the cycle T2 since the immediately preceding level of the input signal is low, it is impossible that the level of the input signal rises to the high level or almost equal to the high level in the cycle T2, due to the long rise time. Taking the above mention into consideration, it is comprehensive that it is preferable to make the level of the reference voltage low in cycle T2 in order to decide the level of the input signal correctly and similarly, it is comprehensive that it is preferable to make the level of the reference voltage high in cycle T8 in order to decide the level of the input signal correctly.

Accordingly, it is comprehensive that, in order to decide the level of the input signal correctly in cycle T2 and T8, it is preferable to change the level of the reference voltage to a low level, in case that the values of the receiving signal in two consecutive cycles immediately preceding to the present cycle are "0" and "0" respectively, and it is preferable to change the level of the reference voltage to a high level, in case that the values of the receiving signal in two consecutive cycles immediately preceding to the present cycle are "1" and "1" respectively.

Since receiving circuit 10 is configured so that the signal, whose waveform is distorted dependently on the immediately preceding level of the signal, may be decided correctly according to the first exemplary embodiment of the present invention, it is possible to make the transmission rate high. Even if the transmission frequency becomes high and consequently, the distortion becomes severely large, it is possible to decide the level of the input signal correctly.

Next, a second exemplary embodiment of the present invention will be described in detail with reference to a drawing.

Figure 7:
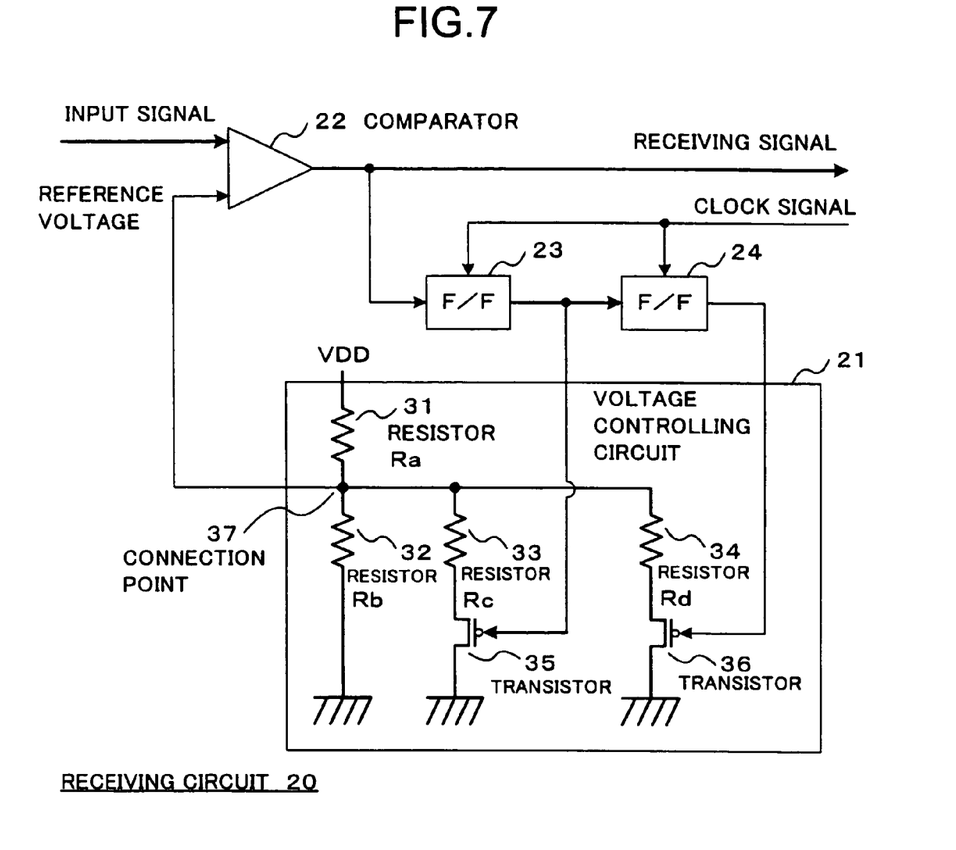
FIG. 7 shows a configuration of receiving circuit 10 according to a second exemplary embodiment of the present invention.

FIG. 7 shows a configuration of receiving circuit 20 according to the second exemplary embodiment of the present invention. The configuration of receiving circuit 20 is a detailed one of receiving circuit 10 of the first exemplary embodiment of the present invention. Particularly, a configuration of voltage controlling circuit 21 is a detailed one of voltage controlling circuit 11.

Receiving circuit 20 includes comparator 22, F/F23 (Flip-Flop), F/F24 and voltage controlling circuit 21. Comparator 22 is an example of comparing circuit 12. Comparator 22 compares the voltage of the input signal with the reference voltage, and outputs the high-level signal in case that the level of the input signal is larger than the reference voltage, and outputs the low-level signal in case that the level of the input signal is smaller than the reference voltage. Comparator 22 can be configured with a usual operational amplifier with no negative feed-back.

F/F23 and F/F24 are examples of storage circuit 13 and storage circuit 14 respectively. F/F, which is so-called flip-flop, inputs a signal at an edge of a clock signal and stores the inputted signal for one clock interval, as well known. F/F23 inputs the output signal of comparator 22, and F/F24 inputs the output signal of F/F23. Since the clock signal is sets to have the same frequency as the transmission frequency, the output signals of F/F23 and F/F24 are held for one cycle respectively.

Voltage controlling circuit 21, which is an example of voltage controlling circuit 11, includes resistor 31, resistor 32, resistor 33, resistor 34, transistor 35 and transistor 36. Further, Ra, Rb, Rc and Rd shown in FIG. 7 are electric resistance values, which are shown in ohm, of resistors 31 to 34 respectively. A switch work of transistor 35 is that transistor 35 is turned on in case that the output level of F/F23 becomes low, and transistor 35 is turned off in case that the output level of F/F23 becomes high. Moreover, a switch work of transistor 36 is that transistor 36 is turned on in case that the output level of F/F24 becomes low, and transistor 36 is turned off in case that the output level of F/F24 becomes high.

One end of resistor 31 is connected to power supply VDD, and the other end is connected to resistors 32 to 34 and comparator 22 via connection paint 37. Further, connection point 37, which is defined to indicate a position, is virtually positioned on a signal line between comparator 22 and resistors 31 to 34. One end of resistor 32 is connected to the ground and the other end is connected to resistors 31, 33 and 34 and comparator 22 via connection point 37. One end of resistor 33 is connected to transistor 35, and the other end is connected to resistors 31, 32 and 34 and comparator 22 via connection point 37. One end of resistor 34 is connected to transistor 36 and the other end is connected to resistors 31 to 33 and comparator 22 via connection point 37.

One end of transistor 35 is connected to the ground and the other end is connected to resistor 33. One end of transistor 36 is connected to the ground and the other end is connected to resistor 34. The reference voltage is corresponding to voltage at connection point 37.

Next, an operation of the second exemplary embodiment of the present invention will be described.

Receiving circuit 20 determines the level of the reference voltage, based on voltage levels of receiving signals in the cycles preceding to the present cycle by one cycle and two cycles. It is assumed that the electric resistance values of resistor 33 and resistor 34 are equal (Rc=Rd) each other.

When receiving circuit 20 receives the input signal, comparator 22 of receiving circuit 20 compares the voltage, which is corresponding to the level of the input signal, with the reference voltage. In case that the level of the input signal is higher than the level of the reference voltage, comparator 22 outputs the high level signal (receiving signal), and in case that the level of the input signal is lower than the level of the reference voltage, comparator 22 outputs the low level signal (receiving signal). Further, it is assumed that the receiving signal value is "1", in case that the level of receiving signal is high, and the receiving signal value is "0", in case that the level of the receiving signal is low. It may be preferable to adopt a reverse mapping.

The receiving signal is usually connected to a circuit (not shown in the figure) which is mounted at the rear of receiving circuit. The receiving signal is provided to F/F23, and is inputted by F/F23 at a next rising edge of the clock signal. The output signal of F/F23 is provided to F/F24, and is inputted by F/F24 at a next rising edge of the clock signal. It may be preferable for F/F23 and F/F24 to input at a falling edge instead of the rising edge of the clock signal. Voltage controlling circuit 21 changes the level of the reference voltage, based on the output signals of F/F23 and F/F24 and supplies the changed level to comparator 22.

Further, if dummy signals, which are allocated in front of the two-level signal to be transmitted, are transmitted for not smaller than 2 cycles on transmitting the signal, the level of the reference voltage, which is used for next receiving input signal, can be adjusted to the most suitable level on the basis of the output signals of F/F23 and F/F24. It is possible that the dummy signal is set to have a continuously low level or a continuously high level, for example.

Next, an operation of voltage controlling circuit 21 will be described.

(1) In case that the output signal values of F/F24 and F/F23 are "0" and "0" respectively, transistors 35 and 36 become on together. Then, the level of the reference voltage is determined, based on a combination of the electrical resistance values Ra, Rb, Rc and Rd of resistors 31 to 34 respectively. Vref_L, which means the level of the reference voltage in this case, is expressed as $$Vref\_L = VDD*(Rb*Rc*Rd)/(Ra*Rb*Rc + Rb*Rc*Rd + Rc*Rd*Ra + Rd*Ra*Rb).$$

If Rd is equal to Rc, Rd is replaced by Rc and then, Vref_L is changed to the following formula, $$Vref\_L = VDD*(Rb*Rc*Rc)/(2*Ra*Rb*Rc + Rc*Rc*Ra + Rb*Rc*Rc).$$

(2) In case that the output signal values of F/F24 and F/F23 are "1" and "0" respectively, transistor 36 becomes off and transistor 35 become on. As a result, resistor 34 becomes ineffective and then, the level of the reference voltage is determined, based on a combination of the electrical resistance values Ra, Rb and Rc of resistors 31 to 33 respectively. Vref_MD, which means the level of the reference voltage in this case, is expressed as $$Vref\_M0 = VDD*(Rb*Rc)/(Ra*Rb + Rb*Rc + Rc*Ra).$$

(3) In case that the output signal values of F/F24 and F/F23 are "0" and "1" respectively, transistor 36 becomes on and transistor 35 become off. As a result, resistor 33 becomes ineffective and then, the level of the reference voltage is determined, based on a combination of the electrical resistance values Ra, Rb and Rd of resistors 31, 32 and 34 respectively. Vref_M1, which means the level of the reference voltage in this case, is expressed as $$Vref\_M1 = VDD*(Rb*Rd)/(Ra*Rb + Rb*Rd + Rd*Ra).$$

If Rd is equal to Rc, Rd is replaced by Rc and then, the following formula is obtained, $$Vref\_M1 = Vref\_M0.$$

Further, Vref_M0 and Vref_M1 are rewritten as Vref_M respectively in this case.

(4) In case that the output signal values of F/F24 and F/F23 are "1" and "1" respectively, transistors 35 and 36 become off together. As a result, resistors 33 and 34 are ineffective and then, the level of the reference voltage is determined, based on a combination of the electrical resistance values Ra and Rb of resistors 31 and 32 respectively. Vref_H, which means the level of the reference voltage in this case, is expressed as $$Vref\_H = VDD*(Rb/(Ra+Rb)).$$

As mentioned above, voltage controlling circuit 21 selects and determines the most suitable level of the reference voltage among Vref_L, Vref_M and Vref_H, based on the output signal values of F/F23 and F/F24. For example, in case that VDD=1V and Ra:Rb:Rc:Rd=1:2:2:2, it is obtained that Vref_L=0.40V, Vref_M=0.50V and Vref_L=0.67V.

In this case, receiving circuit 20 can select the level of the reference voltage out of three values of 0.40V, 0.50V and 0.67V.

Next, an operation of receiving circuit 20 will be described with reference to FIG. 8, focusing on an operation for switching the level of the reference voltage. It is assumed in FIG. 8 that cycles T0 and T1 are for the dummy signals, and cycle T2 and the cycles following cycle T2 are for the effective input signals. Since the receiving signal values in cycle T0 and T1 are "0" and "0" respectively, the level of the reference voltage in cycle T2 is set to Vref_L. The input signal, which is received in cycle T2, is inputted by F/F23 at a point of time corresponding to the rising edge of the clock signal, that is, at a point of time corresponding to a boundary between cycle T2 and cycle T3. Since the level of the reference voltage becomes low at this point of time, the input signal can be decided to be "1" correctly.

In case of cycle T3, receiving circuit 20 sets the level of the reference voltage to Vref_M, since the receiving signal values in two consecutive cycles immediately preceding to cycle T3 are "0" and "1" respectively. Moreover, in case of cycle T4, receiving circuit 20 sets the level of the reference voltage to Vref_M, since the receiving signal values in two consecutive cycles immediately preceding to cycle T4 are "1" and "0" respectively. Furthermore, in case of cycle T5, receiving circuit 20 sets the level of the reference voltage to Vref_L, since the receiving signal values in two consecutive cycles immediately preceding to cycle T5 are "0" and "0" respectively.

Thus, receiving circuit 20 operates, switching the level of the reference voltage in each cycle on the basis of the receiving signal value in the cycle immediately preceding to the present cycle. Afterward, in case of cycle T8, receiving circuit 20 sets the level of the reference voltage to Vref_H, since the receiving signal values in two consecutive cycles immediately preceding to cycle T8 are "1" and "1" respectively. Receiving circuit 20 can decides the input signal to be "0" correctly in cycle T8 by setting the level of the reference voltage to Vref_H.

Next, in case of cycle T9, receiving circuit 20 sets the level of the reference voltage to Vref_M, since the receiving signal values in two consecutive cycles immediately preceding to cycle T9 are "1" and "0" respectively. Moreover, in case of cycle T10, receiving circuit 20 sets the level of the reference voltage to Vref_M, since the receiving signal values in two consecutive cycles immediately preceding to cycle T10 are "0" and "1" respectively. In this case, since the immediately preceding level of the input signal is lower than the high level, the level of the input signal also becomes lower than Vref_M. As a result, receiving circuit 20 can decides the input signal correctly without setting the level of the reference voltage to Vref_H.

Thus, receiving circuit 20 operates, switching the level of the reference voltage to one level out of Vref_H, Vref_M and Vref_L on the basis of the immediately preceding receiving signal value to cope with the distortion that the signal level depends on the immediately preceding level of the input signal, according to the second exemplary embodiment of the present invention. Since receiving circuit 20 can decides the input signal correctly even if the waveform of the input signal is caused the distortion that the input signal level depends on the preceding input signal level, it is possible to make the transmission rate high. Even if the transmission frequency becomes high and consequently, the distortion becomes severely large, it is possible to decide the receiving signal correctly.

Moreover, since voltage controlling circuit 21 of receiving circuit 20 can be configured with only four resistors and two transistors, voltage controlling circuit 21 has a feature that voltage controlling circuit 21 is realized with very low cost and a mounting area in LSI chip is very small in case that voltage controlling circuit 21 is mounted in LSI chip. Accordingly, the present invention becomes advantageous if a plurality of receiving circuits 20 is mounted in one LSI chip.

According to the above mentioned description, the ratio of the electric resistance values of resistors 31 to 34 is used. It is preferable that the electric resistance values should be determined in consideration of the transmission frequency and the power consumption. For example, in case that the electric resistance value is set small, the power consumption of the resistor becomes large, since the electric current passing through the resistor become large. In case that receiving circuit 20 is mounted in LSI, lower limit of the electric resistance value is determined due to limitation of LSI power consumption. On the other hand, in case that the electric resistance value is set large, delay time from a time when the output signals of F/F23 and F/F24 are updated until a time when the voltage at connection point 37 is changed to the level of the reference voltage becomes long. Upper limit of the electric resistance value is determined, based on the permissible delay time. The electric resistance value should be set less than the upper limit value and larger than the lower limit value.

Next, a third exemplary embodiment of the present invention will be described in detail with reference to a drawing.

According to the configuration of the second exemplary embodiment of the present invention, it is assumed that influence of the level in the cycle, which precedes the present cycle by one cycle, on the level in the present cycle is equivalent to influence of the level in the cycle, which precedes the present cycle by two cycle, on the level in the present cycle, and then, Rc and Rd are set equal each other. In contrast, according to the third exemplary embodiment of the present invention, it is assumed that the influence of the level in the cycle, which precedes the present cycle by one cycle, on the level in the present cycle is larger than the influence of level in the cycle, which precedes the present cycle by two cycle, on the level in the present cycle, and then the level of the reference voltage is controlled, based on the assumption. Since the configuration of the third exemplary embodiment of the present invention is the almost same as one of the second exemplary embodiment of the present invention (FIG. 7) and a difference between the third and the second exemplary embodiments of the present invention is only in the electric resistance value, description on the configuration of the third exemplary embodiment of the present invention is omitted and only a different operation will be described in the following.

According to the third embodiment of the present invention, since the influence of the level in the immediately preceding cycle is reflected strongly to the level of the reference voltage, a level of the reference voltage (referred to as Vref_M0), which is Vref_M in case that the output signals of F/F24 and F/F23 are "1" and "0" respectively, is set lower than a level of the reference voltage (referred to as Vref_M1), which is Vref_M in case that the output signals of F/F24 and F/F23 are "0" and "1" respectively. Specifically, the above mentioned setting can be realized by making electric resistance value Rc of resistor 33 corresponding to F/F23 smaller than electric resistance value Rd of resistor 34 corresponding to F/F24.

For example, in case that VDD=1V and Ra:Rb:Rc:Rd=1:2:1.5:2.5, it is obtained that Vref_L=0.39V, Vref_M0=0.46V, Vref_M1=0.53V and Vref_L=0.67V.

These reference voltages can be calculated by use of the above-mentioned formulas of (1) to (4). Accordingly, receiving circuit 20 can select the level of the reference voltage out of four values of 0.39V, 0.46V, 0.53V and 0.67V.

While Vref_M0 and Vref_M1 are set to 0.5V according to the second exemplary embodiment of the present invention, Vref_M0, which means Vref_M in case that the receiving signal value in the cycle preceding by one cycle is "0", is set to 0.46V, and Vref_M1, which means Vref_M in case that the receiving signal value in the cycle preceding by one cycle is "1", is set to 0.53V, according to the third exemplary embodiment of the present invention. That is, the immediately preceding level is regarded as important.

An operation of receiving circuit 20 will be described in FIG. 9, focusing on an operation for switching the level of the reference voltage, according to the third exemplary embodiment of the present invention. Voltage controlling circuit 21 generates the level of the reference voltage by turning transistors 35 and 36 on and off on the basis of the receiving signal values in the cycles immediately preceding by one and two cycles, similarly to the second exemplary embodiment of the present invention. While Vref_M0 and Vref_M1 are set to 0.5V together with reference to FIG. 8 which shows the operation according to the second exemplary embodiment of the present invention, Vref_M0 is set to 0.46V and Vref_M1 is set to 0.53V in FIG. 9. That is, Vref_M0 and Vref_M1 are set to different values each other.

Figure 9:
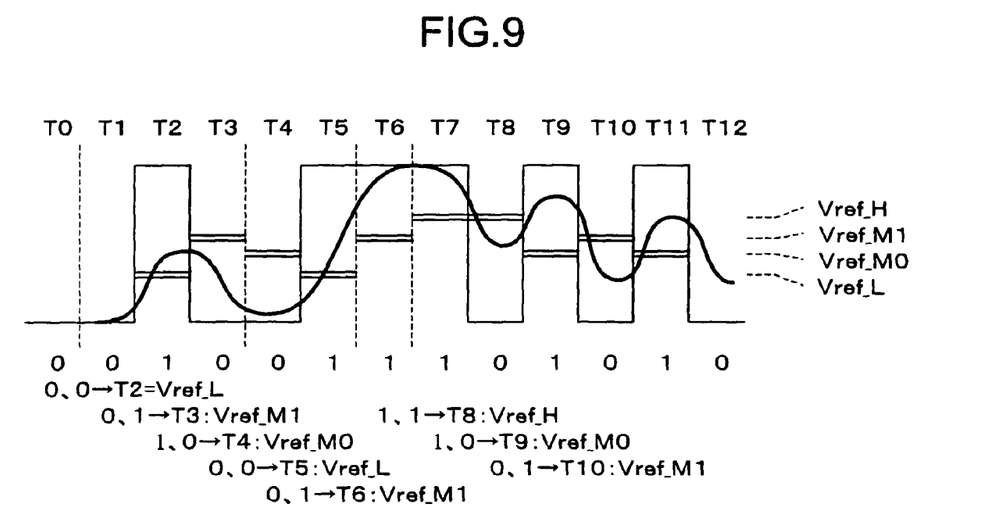
FIG. 9 shows an example of carrying out a correct decision through applying the present invention to avoid the erroneous decision.

Since the level of the reference voltage is Vref_L (0.39V) in cycle T2, the input signal can be decided correctly as shown in FIG. 9. Moreover, since the level of the reference voltage is Vref_H (0.67V) in cycle T8, the input signal can be decided correctly. Even if the waveform of the input signal is distorted, the input signal is decided correctly according to the third exemplary embodiment of the present invention, similarly to the second exemplary, embodiment of the present invention.

Figure 10:
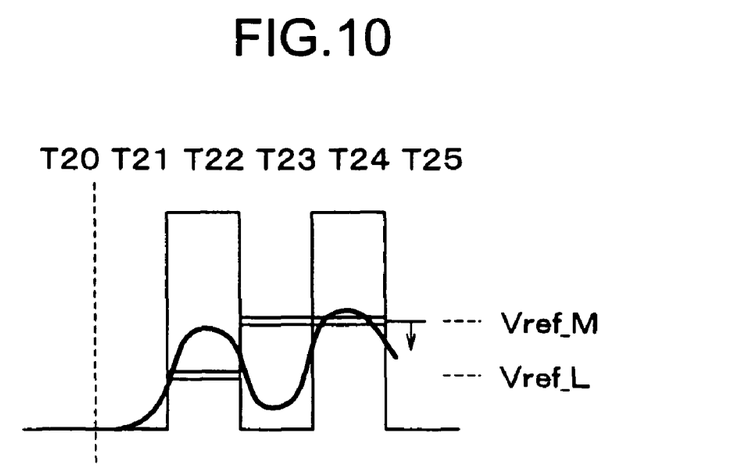
FIG. 10 shows an example of an operation according to the second exemplary embodiment of the present invention.

A different operation of the third exemplary embodiment of the present invention from the second exemplary embodiment of the present invention will be described in the following with reference to FIG. 10 and FIG. 11. FIG. 10 shows a receiving waveform in case that the sending data in cycles T22, T23 and T24 are "1", "0" and "1" respectively according to the second exemplary embodiment of the present invention. Moreover, it is assumed that sending data in the cycles preceding to T21 are "0", and that the waveform is caused the distortion strongly by the level in the cycle preceding by one cycle.

The level of the input signal does not rise sufficiently in cycle T22 but the level of the reference voltage is set to Vref_L, since the receiving signal values in two consecutive cycles immediately preceding to cycle T22 are "0" and "0" respectively. As a result, the input signal is decided correctly. Moreover, in case of cycle T24, the level of the reference voltage is set to Vref_M, since the receiving signal values in two consecutive cycles immediately preceding to cycle T24 are "1" and "0" respectively. However, since the immediately preceding level is low and the input signal is strongly dependent on this level as mentioned above, the level of the input signal does not rise sufficiently and does not reach to Vref_M at a point of time corresponding to the boundary between cycle T24 and cycle T25. As a result, the input signal is decided erroneously.

Figure 11:
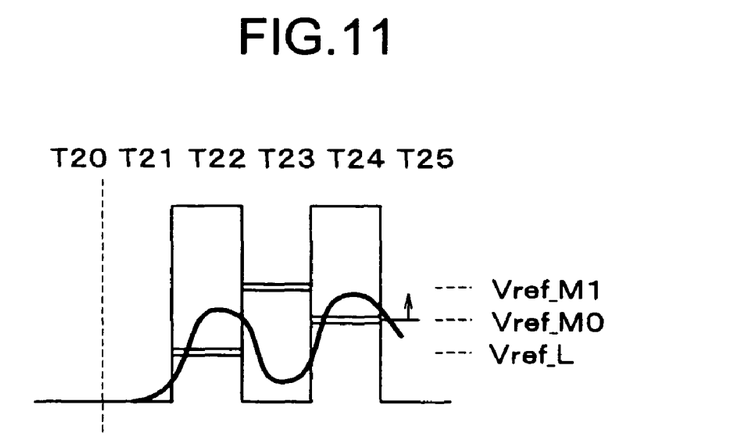
FIG. 11 shows an example of an operation according to a third exemplary embodiment of the present invention.

In contrast, an operation of the third exemplary embodiment of the present invention is shown in FIG. 11. In case of cycle T24, the level of the reference voltage is set to Vref_M0, since the receiving signal values in two consecutive cycles immediately preceding to T24 are "1" and "0" respectively. Moreover, it is possible to make Vref_M0 smaller than Vref_M. As a result, the input signal is decided correctly even in cycle T24, according to the third exemplary embodiment of the present invention.

Further, A ratio of the influence of the level in the cycle preceding to the present cycle by two cycles on the level in the present cycle to the influence of the level in the cycle preceding to the present cycle by one cycle on the level of the present cycle depends on the transmission frequency and the electric characteristics of the transmission path. It is possible to select either the second or the third exemplary embodiment of the present invention, based on the ratio which is determined by the transmission frequency and the electric characteristics of the transmission path. It is preferable to select the second exemplary embodiment of the present invention in case that the ratio is almost equal to 1 or the ratio is not clear and to select the third exemplary embodiment of the present invention in case that the ratio is not almost equal to 1, that is, in case that the influence of the level in the preceding cycle by two cycles is smaller than one by one cycle.

Further, the electric resistance value is an example. In case that a difference between electric resistance value Rd and electric resistance value Rc becomes small, a difference between Vref_M0 and Vref_M1 also becomes small. On the other hand, in case that the difference between electric resistance value Rd and electric resistance value Rc becomes large, the difference between Vref_M0 and Vref_M1 also becomes large. It is possible to determine the electric resistance value, based on the transmission frequency and the electric characteristics of the transmission path.

Thus, receiving circuit 20 operates, switching the level of the reference voltage to one of Vref_H, Vref_M0, Vref_M1 and Vref_L on the basis of the preceding receiving signal value to cope with the distortion that the waveform of input signal is depending on the immediately preceding level. Since receiving circuit 20 is configured so that the input signal, whose waveform is distorted dependently on the level in the immediately preceding cycle, may be decided correctly, it is possible to make the transmission rate high. Even if the transmission frequency becomes high and consequently, the distortion becomes severely large, it is possible to decide the input signal correctly.

Next, a fourth exemplary embodiment of the present invention will be described in detail with reference to a drawing.

Figure 12:
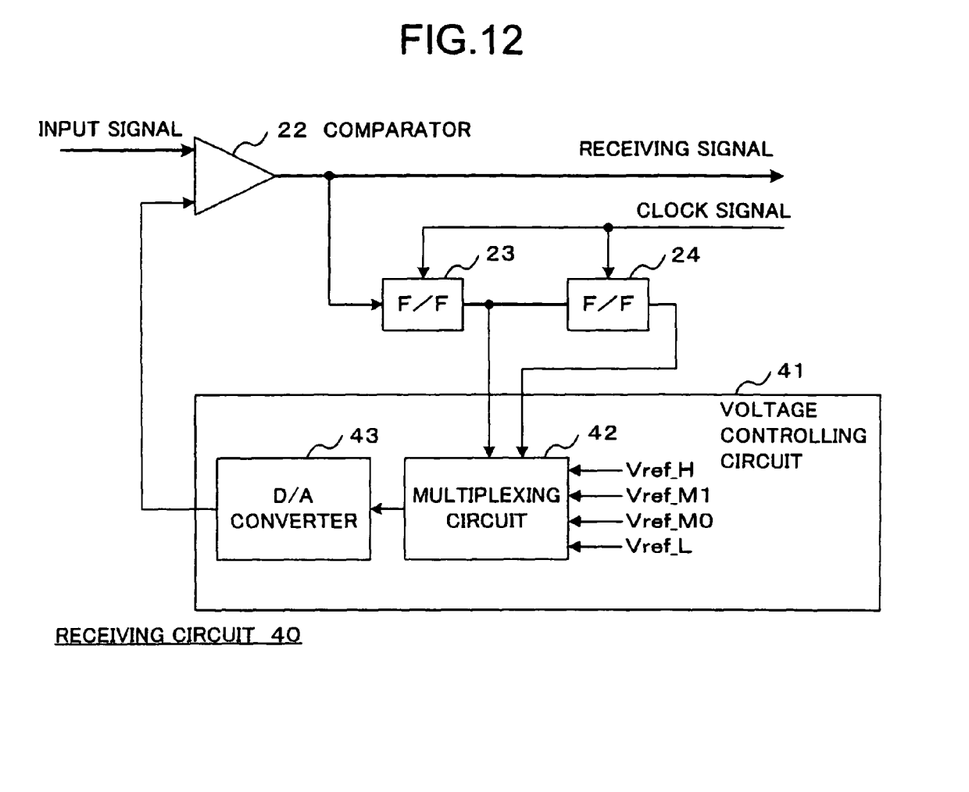
FIG. 12 shows a configuration of receiving circuit 40 according to a fourth exemplary embodiment of the present invention.

FIG. 12 shows a configuration of receiving circuit 40 according to the fourth embodiment of the present invention. Receiving circuit 40 has a configuration in which voltage controlling circuit 21 of receiving circuit 20 of the second exemplary embodiment of the present invention is replaced with voltage controlling circuit 41. For this reason, the same constituent in FIG. 12 as one in FIG. 7 is assigned the same code in FIG. 12 as one in FIG. 7 and description on the same constituent with the same code is omitted.

Voltage controlling circuit 41 is an example of voltage controlling circuit 11 of the first exemplary embodiment of the present invention and includes multiplexing circuit 42 and D/A converter 43. D/A converter 43 has a function to adjust its output voltage, which is ranged from 0V to VDD, by direction of a digital signal outputted from multiplexing circuit 42.

Multiplexing circuit 42 is so-called four way selector which selects one digital value out of four digital values by 2 bits selection signal and outputs the selected digital value. The output signals of F/F23 and F/F24 are provided to multiplexing circuit 42 as the 2 bits selection signal. Multiplexing circuit 42 selects a low level voltage value in case that the output signal values of F/F24 and F/F23 are "0" and "0" respectively, and selects a medium level 1 voltage value in case that the output signal values of F/F24 and F/F23 are "0" and "1", and selects a medium level 0 voltage value in case that the output signal values of F/F24 and F/F23 are "1" and "0" respectively, and selects a high level voltage value in case that the output signal values of F/F24 and F/F23 are "1" and "1" respectively.

Next, an operation of receiving circuit 40 will be described according to the fourth exemplary embodiment of the present invention.

Since the operation of receiving circuit 40 except for an operation of voltage controlling circuit 41 is the same as one of receiving circuit 20, only operation of voltage controlling circuit 41 will be described in the following and description on other operation is omitted.

When F/F23 and F/F24 input the output signal of comparator 22, the output signals of F/F23 and F/F24 are provided to multiplexing circuit 42 as the selection signal. Multiplexing circuit 42 selects the voltage value, based on the selection signal and outputs the selected voltage value to D/A converter 43.

D/A converter 43 outputs a voltage corresponding to the voltage value outputted from multiplexer 42. Since one voltage value out of the low level voltage value, the medium level 0 voltage value, the medium level 1 voltage value and the high level voltage value is outputted from multiplexing circuit 42, D/A converter 43 can output one reference voltage, which is corresponding to one selected voltage value out of the low level voltage value, the medium level 0 voltage value, the medium level 1 voltage value and the high level voltage value, out of Vref_L, Vref_M0, Vref_M1 and Vref_H.

For example, a case that VDD is 1V and D/A converter 43 supplies an output voltage which is switched within a range from 0V to 1V in a unit voltage of 0.05V will be described in the following. It is necessary for D/A converter 43 to input a digital value of not smaller than 5 bits in order to specify one voltage out of 21 stage voltages which are ranged from 0V to 1V in the voltage unit of 0.05V. In case that the digital value is "0", D/A converter 43 outputs 0V. Moreover, in case that the digital value increases by "1", the output voltage of D/A converter 43 increases by 0.05V. But, in case that the output voltage has reached 1V, the output voltage is held to 1 v even if the digital value increases furthermore.

Figure 8:
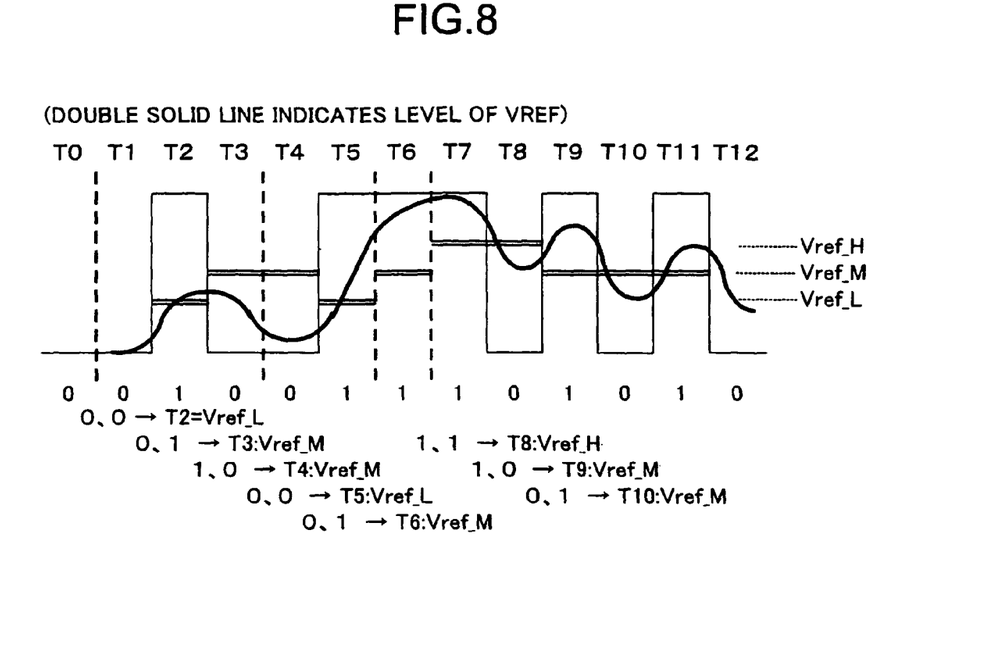
FIG. 8 shows an example of carrying out a correct decision through applying the present invention to avoid the erroneous decision.

For example, in case that Vref_M0 and Vref_M1 are set equal each other, it is possible to carry out the same receiving operation as the receiving operation described in FIG. 8, and in case that Vref_M0 is set smaller than Vref_M1, it is possible to carry out the same receiving operation as the receiving operation described in FIG. 9. Specifically, for example, in case that the medium level 0 voltage value and the medium level 1 voltage value are set to "10" together, Vref_M0 and Vref_M1 can be set to 0.5V (0.05×10) together. Moreover, in case that the low level voltage value is set to "8" and the high level voltage value is set to "13", Vref_L and Vref_H can be set to 0.4V and 0.65V respectively. That is, it is possible to set the level of the reference voltage to the almost equivalent level which is set according to the second exemplary embodiment of the present invention. The operation in this case is shown in FIG. 8.

For example, in case that the low level voltage value, the medium level 0 voltage value, the medium level 1 voltage value and the high level voltage value are set to "8", "9", "11" and "13" respectively, Vref_L, Vref_M0, Vref_M1 and Vref_H can be set to 0.4V, 0.45V, 0.55V and 0.65V respectively. That is, it is possible to set the level of the reference voltage to the almost equivalent level which is set according to the third exemplary embodiment of the present invention. The operation in this case is shown in FIG. 9.

The above mentioned configuration can make it possible that receiving circuit 20 switches and sets the level of the reference voltage to any one of Vref_H, Vref_M0, Vref_M1 and Vref_L in each cycle on the basis of the output signals of F/F23 and F/F24.

While receiving circuit 40 is different from receiving circuit 20 in the configuration of voltage controlling circuit 41, other configuration and other operation of receiving circuit 40 are the same as ones of receiving circuit 20. Since the operation, in which comparator 22 outputs the receiving signal value corresponding to the decided level of the input signal by use of the determined level of the reference voltage, is the same as one of receiving circuit 20, receiving circuit 40 also can decide the level of the input signal, which is shown in FIG. 8 and FIG. 9, correctly like reception circuit 20.

Since receiving circuit 40 is configured so that the level of the input signal, whose waveform is distorted dependently on the level in the immediately preceding cycle, may be decided correctly according to the fourth exemplary embodiment of the present invention, it is possible to make the transmission rate high. Even if the transmission frequency becomes high and consequently, the distortion becomes severely large, it is possible to decide the input signal correctly.

While D/A converter 43 is configured so that its output voltage is switched in the voltage unit of 0.05V according to the above mentioned description, the voltage unit for switching the level of the reference voltage is not limited to 0.05V. It is also possible to set the voltage unit so as to switch the reference voltage finely. Since receiving circuit 40 is configured to determine the level of the reference voltage not on the basis of the ratio of the electric resistance values but by D/A converter 43, it is possible to set the level of the reference voltage to a desired voltage value easily.

In contrast, receiving circuit 20 determines the level of the reference voltage, based on the ratio of the electric resistance value of resistor 31 to the parallel electric resistance value of the resistors including three resistors 32 to 34. For this reason, there is a restriction that the level of the reference voltage depends on the electric resistance values of resistors 31 to 34 and can not be set linearly. On the other hand, receiving circuit 40 has a feature that receiving circuit 40 can set the level of the reference voltage with no restriction mentioned above, since receiving circuit 40 specifies the level of the reference voltage with the digital value.

On the other hand, since voltage controlling circuit 21 of receiving circuit 20 is configured only by four resistors and two transistors, it is possible that receiving circuit 20 is smaller than receiving circuit 40 in circuit scale. In case that a plurality of the receiving circuits is mounted in one LSI, receiving circuit 20 is more advantageous than receiving circuit 40. That is, it is preferable that receiving circuit 20 and receiving circuit 40 may be selected on the basis of conditions on mounting in LSI. Moreover, Vref_H, Vref_M0, Vref_M1 and Vref_L as the level of the reference voltage can be set, based on the transmission frequency and the electric characteristics of the transmission path.

While comparator 22 has been described as the example of comparing circuit 12 in the above mentioned description, it is possible for comparing circuit 12 to have another configuration in which the input signal is converted into a digital value by an A/D converter and a logic circuit compares the digital value of the input signal with a digital value of the level of the reference voltage. In particular, this configuration is suitable for receiving circuit 40 described in the fourth exemplary embodiment of the present invention. Since comparing circuit 12 is a digital comparator to compare the digital values in this case, D/A converter 43 becomes unnecessary in receiving circuit 40, and then, it is possible for comparing circuit 12 to input directly the digital value which is outputted by multiplexing circuit 42.

Next, a fifth exemplary embodiment of the present invention will be described.

Figure 13:
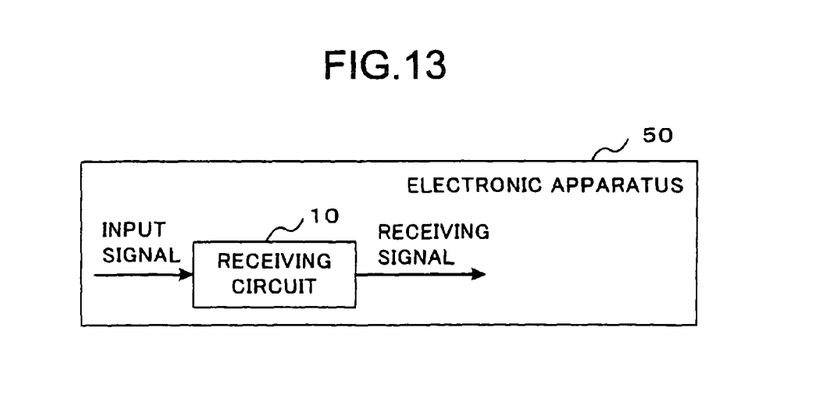
FIG. 13 shows a configuration of electronic apparatus 50 according to a fifth exemplary embodiment of the present invention.
Figure 14:
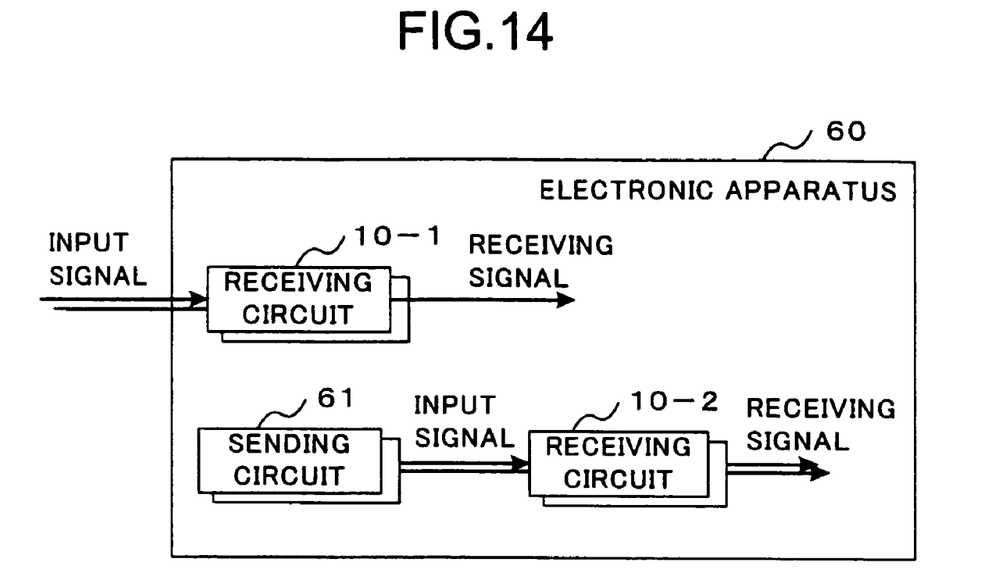
FIG. 14 shows a configuration of electronic apparatus 60 according to the fifth exemplary embodiment of the present invention.

FIG. 13 and FIG. 14 show configurations of electronic apparatus 50 and electronic apparatus 60 respectively according to the fifth exemplary embodiment of the present invention. Electronic apparatuses 50 and 60 include receiving circuit 10. Since receiving circuit 20 and receiving circuit 40 are detailed examples of receiving circuit 10 as mentioned above, receiving circuit 10 is replaced with receiving circuit 20 or receiving circuit 40 in FIG. 13 and FIG. 14. Since the configurations and the operations of receiving circuits 10, 20 and 40 have been described already, description on operations of these receiving circuits in a state that these receiving circuits are mounted on electronic apparatuses 50 and 60 is omitted.

Electronic apparatus 50 and electronic apparatus 60 are computers, communication apparatuses, mobile phones or the like which require a high-speed data transmission capability. Moreover, if a home electrical appliance or the like requires the high-speed data transmission capability, the home electrical appliance or the like is also included in a category of electronic apparatuses 50 and 60. LSI with a function as the computer and the communication apparatus is also included in the category of the electronic apparatus.

Electronic apparatus 50 includes receiving circuit 10 in order to carry out the high speed data transmission and electronic apparatus 60 has another configuration including the receiving circuit. Specifically, electronic apparatus 60 includes a configuration in which receiving circuit 10 receives a signal transmitted at a high speed from the outside of electronic apparatus 60 and a configuration in which another receiving circuit receives a signal transmitted at a high speed from sending circuit 61 of electronic apparatus 60. It may be preferable that electronic apparatus 60 has a configuration which includes any one of two receiving circuits 10. The configuration in which receiving circuit 10 receives the signal transmitted at a high speed from the outside is used in case that a function of electronic apparatus 60 is mounted in LSI.

Since electronic apparatus 50 and electronic apparatus 60 include receiving circuits 10, 20 and 40 according to the fifth exemplary embodiment of the present invention, electronic apparatus 50 and electronic apparatus 60 are configured so that the signal, whose waveform is distorted dependently on the level in the immediately preceding cycle, may be decided correctly like receiving circuit 10, 20 and 40. As a result, it is possible to make the transmission rate high. Even if the transmission frequency becomes high and consequently, the distortion becomes severely large, it is possible to decide the input signal correctly.

Since the signal, whose waveform is distorted dependently on levels in the immediately preceding several cycles, can be decided correctly according to the present invention, the present invention has an effect that it is possible to make the transmission rate high.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A receiving circuit, comprising:
a comparing circuit which compares an input signal with a reference voltage and outputs a signal with either a first level when the input signal is larger than the reference voltage or a second level when the input signal is smaller than the reference voltage as a comparison result;
a first storage circuit which stores an output level of the comparing circuit for a next one cycle;
a second storage circuit which stores an output level of the first storage circuit for a next one cycle; and
a voltage controlling circuit which controls a level of the reference voltage in each cycle on the basis of output levels of the first storage circuit and the second storage circuit,
wherein the voltage controlling circuit makes a level of the reference voltage highest in case that output levels of the first storage circuit and the second storage circuit are the first level together, and makes a level of the reference voltage second highest in case that an output level of the first storage circuit is the first level and an output level of the second storage circuit is the second level, and makes a level of the reference voltage third highest in case that an output level of the first storage circuit is the second level and an output level of the second storage circuit is the first level, and makes a level of the reference voltage lowest in case that output levels of the first storage circuit and the second storage circuit are the second level together, and
wherein the voltage controlling circuit comprises an electronic circuit in which a first resistor and a second resistor, which are connected in series together, are arranged between a power supply and the ground, and in which voltage at a connection point of the first resistor and the second resistor is provided to the comparing circuit as a reference voltage, and in which a third resistor and a first transistor, which is turned on and off by an output level of the first storage circuit, are connected in series together and are arranged between the connection point and the ground, and in which a fourth resistor and a second transistor, which is turned on and off by an output level of the second storage circuit, are connected in series together and are arranged between the connection point and the ground.

2. The receiving circuit according to claim 1, wherein the voltage controlling circuit makes the second highest level and the third highest level equal together.

3. An electronic apparatus, comprising:
a receiving circuit including a comparing circuit which compares an input signal with a reference voltage and outputs a signal with either a first level when the input signal is larger than the reference voltage or a second level when the input signal is smaller than the reference voltage as a comparison result, a first storage circuit which stores an output level of the comparing circuit for a next one cycle, a second storage circuit which stores an output level of the first storage circuit for a next one cycle and a voltage controlling circuit which controls a level of the reference voltage in each cycle on the basis of output levels of the first storage circuit and the second storage circuit,
wherein the voltage controlling circuit makes a level of the reference voltage highest in case that output levels of the first storage circuit and the second storage circuit are the first level together, and makes a level of the reference voltage second highest in case that an output level of the first storage circuit is the first level and an output level of the second storage circuit is the second level, and makes a level of the reference voltage third highest in case that an output level of the first storage circuit is the second level and an output level of the second storage circuit is the first level, and makes a level of the reference voltage lowest in case that output levels of the first storage circuit and the second storage circuit are the second level together, and
wherein the voltage controlling circuit comprises an electronic circuit in which a first resistor and a second resistor, which are connected in series together, are arranged between a power supply and the ground, and in which voltage at a connection point of the first resistor and the second resistor is provided to the comparing circuit as a reference voltage, and in which a third resistor and a first transistor, which is turned on and off by an output level of the first storage circuit, are connected in series together and are arranged between the connection point and the ground, and in which a fourth resistor and a second transistor, which is turned on and off by an output level of the second storage circuit, are connected in series together and are arranged between the connection point and the ground.

4. The electronic apparatus according to claim 3, wherein the voltage controlling circuit makes the second highest level and the third highest level equal together.

* * * * *